US012562144B2

(12) United States Patent
Wild et al.

(10) Patent No.: US 12,562,144 B2
(45) Date of Patent: Feb. 24, 2026

(54) ACOUSTIC ECHO CANCELLATION UNIT

(71) Applicant: Fraunhofer-Gesellschaft zur Foerderung der angewandten Forschung e.V., Munich (DE)

(72) Inventors: Moritz Wild, Erlangen (DE); Emanuel Habets, Erlangen (DE); Edwin Mabande, Erlangen (DE); Guendalina Milano, Erlangen (DE); Maria Luis Valero, Erlangen (DE); Philipp Goetz, Erlangen (DE); Andreas Walther, Erlangen (DE); Fabian Kuech, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 139 days.

(21) Appl. No.: 17/581,657

(22) Filed: Jan. 21, 2022

(65) Prior Publication Data

US 2022/0148559 A1    May 12, 2022

Related U.S. Application Data

(63) Continuation of application No. PCT/EP2020/070671, filed on Jul. 22, 2020.

(30) Foreign Application Priority Data

Jul. 23, 2019    (EP) .................................... 19187880

(51) Int. Cl.
*G10K 11/178*        (2006.01)
*H03F 3/183*        (2006.01)
(Continued)

(52) U.S. Cl.
CPC .. *G10K 11/17854* (2018.01); *G10K 11/17823* (2018.01); *H03F 3/183* (2013.01);
(Continued)

(58) Field of Classification Search
CPC ....... G10K 11/17854; G10K 11/17823; G10K 2210/3028; G10K 2210/505; H03F 3/183;
(Continued)

(56) References Cited

U.S. PATENT DOCUMENTS 10,013,995 B1 *    7/2018    Lashkari ............. G10L 21/0208
10,229,698 B1        3/2019    Chhetri
(Continued)

FOREIGN PATENT DOCUMENTS

JP        2007288775 A    11/2007
RU            2472237 C2    1/2013
WO        2018193028 A1    10/2018

*Primary Examiner* — Daniel R Sellers
(74) *Attorney, Agent, or Firm* — Perkins Cole LLP; Michael A. Glenn

(57) ABSTRACT

An acoustic echo cancellation unit includes: an audio processor configured to receive a multichannel audio signal and including: a first stage which is configured to process the multichannel audio signal to obtain a first set of spatial audio components; and a second stage which is configured to process the first set of spatial audio components to obtain a second set of spatial audio components; an echo cancellation processor configured to perform echo cancellation by use of the first set of spatial audio components or a deviated version of the first set of spatial audio components as reference signal.

16 Claims, 4 Drawing Sheets

(51) Int. Cl.

| | |
|---|---|
| *H04R 5/02* | (2006.01) |
| *H04R 5/04* | (2006.01) |
| *H04S 3/00* | (2006.01) |

(52) U.S. Cl.
CPC ................. *H04R 5/02* (2013.01); *H04R 5/04* (2013.01); *H04S 3/008* (2013.01); *G10K 2210/3028* (2013.01); *G10K 2210/505* (2013.01); *H03F 2200/03* (2013.01); *H04S 2400/01* (2013.01); *H04S 2400/03* (2013.01)

(58) Field of Classification Search
CPC ......... H03F 2200/03; H04R 5/02; H04R 5/04; H04S 3/008; H04S 2400/01; H04S 2400/03
See application file for complete search history.

(56) References Cited

U.S. PATENT DOCUMENTS

| | | | |
|---|---|---|---|
| 2008/0031466 A1 | 2/2008 | Buck et al. | |
| 2008/0198779 A1 | 8/2008 | Jaermyr et al. | |
| 2012/0076308 A1* | 3/2012 | Kuech ..................... | H04R 3/02 |
| | | | 381/66 |
| 2015/0249884 A1 | 9/2015 | Ooi et al. | |
| 2019/0373390 A1* | 12/2019 | Horbach ................ | H04R 5/027 |
| 2019/0392853 A1* | 12/2019 | Kleijn ................ | G10L 21/0208 |

* cited by examiner

100

132

144

142

134

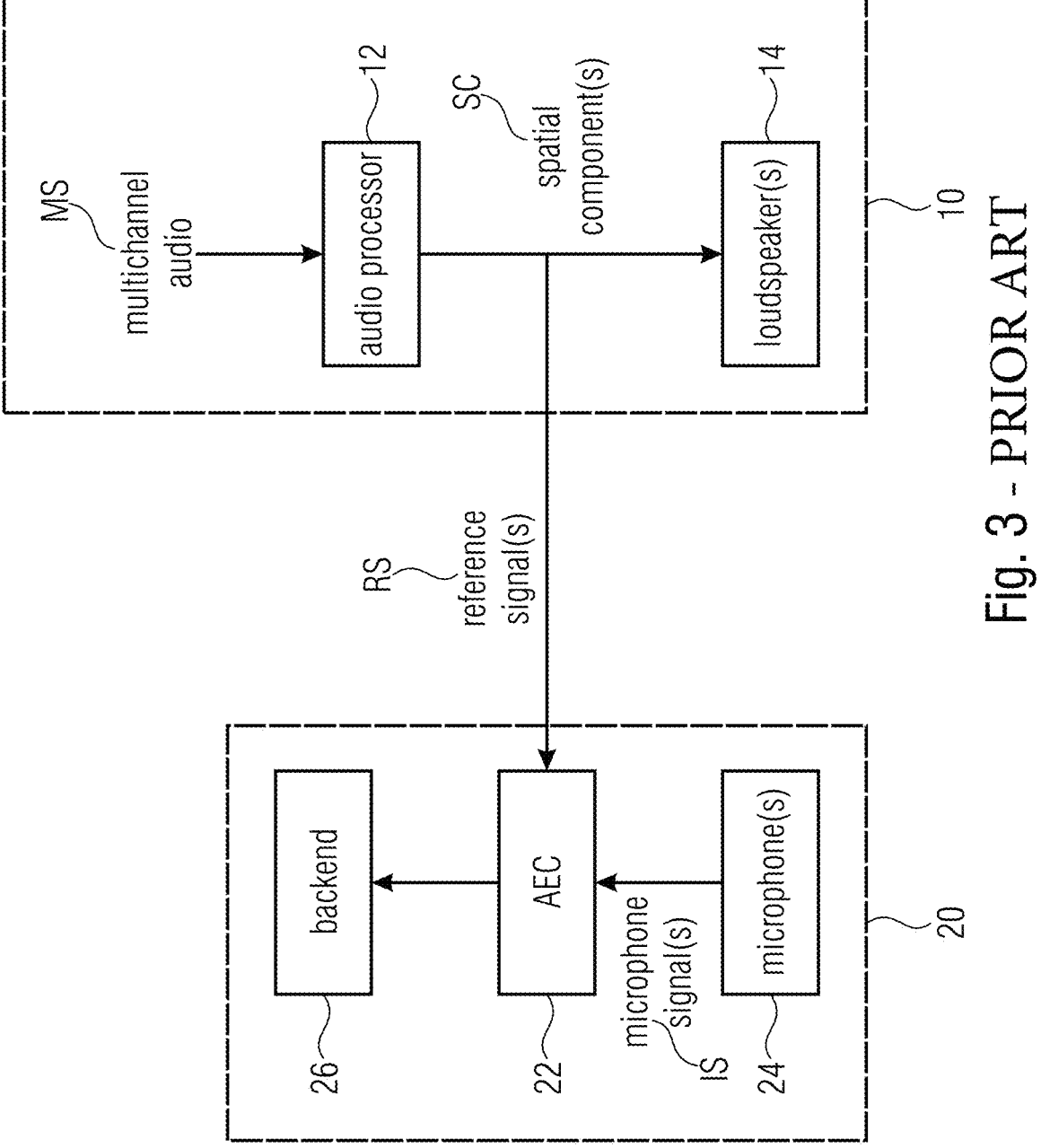
Fig. 3 – PRIOR ART

ACOUSTIC ECHO CANCELLATION UNIT

CROSS-REFERENCES TO RELATED APPLICATIONS

This application is a continuation of copending International Application No. PCT/EP2020/070671, filed Jul. 22, 2020, which is incorporated herein by reference in its entirety, and additionally claims priority from European Application No. EP 19187880.0, filed Jul. 23, 2019, which is incorporated herein by reference in its entirety.

Embodiments of the present invention refer to an acoustic echo cancellation unit and to a corresponding method. Further embodiments refer to a computer program. Another embodiment provides a soundbar or another playback device comprising an acoustic echo cancellation unit. Advantageous embodiments of the present invention relate to the field of processing audio signals, more specifically to an approach for acoustic echo cancellation (AEC) for a multichannel audio playback.

BACKGROUND OF THE INVENTION

Acoustic echo cancellation is desirable for a wide range of applications. For instance, it facilitates human-machine interaction with far-field sound capture and barge-in functionality and enables full-duplex voice communication. In order to perform AEC, typically a microphone signal or plurality of microphone signals and AEC reference signal or a AEC reference signal comprising one, two or more channels are used. Generally, all of the methods in the literature use the loudspeaker driving signals as reference signal as shown by FIG. 3.

FIG. 3 shows an audio processing path 10 as well as an acoustic echo cancellation path 20.

The audio processing path 10 comprises an audio processor 12 as well as one or more loudspeakers 14. The loudspeakers 14 may be formed by a conventional multi-speaker setup (5.1 or 7.2, etc.) or by a soundbar having at least one, advantageously two or three or more transducers.

The audio processor 12 receives a multichannel audio (e.g., a 5.2 or 7.2 signal) and processes same, such that a surround sound can be reproduced by use of the loudspeaker 14. For example, the audio processor 12 is configured to process the multichannel audio signal MS to obtain spatial components SC via which the sound bar 14 is controlled.

The echo cancellation path 20 comprises an acoustic echo cancellation unit 22 which is configured to calculate echo cancellation components based on an input signal IS and a reference signal RS. As input signal IS a microphone signal from one or more microphones (cf. reference numeral 24) is used. Typically, the spatial components SC are used as reference signal RS. Therefore, the echo cancellation unit 22 comprise an input for the reference signal RS which is connected to the audio processor 12 and for the one or more microphones 24. The echo cancellation parameters are output to the backend 26.

A significant AEC performance degradation may be expected when a large number of loudspeakers 14 are used and/or there exists a high correlation between the loudspeaker driving signals as is the usual case for playback of multichannel audio with soundbars. The correlation between the loudspeaker driving signals can be reduced by applying decorrelation methods but this comes at a cost of reproduction fidelity and is therefore undesirable for some applications. Therefore, there is the need for an improved approach.

SUMMARY

According to an embodiment, an acoustic echo cancellation unit may have:
an audio processor which is configured to receive a multichannel audio signal and may have:
a first stage which is configured to process the multichannel audio signal to obtain a first set of spatial audio components representing an interim signal; and
a second stage which is configured to process the first set of spatial audio components to obtain a second set of spatial audio components representing loudspeaker playback signals;
an echo cancellation processor configured to perform echo cancellation by use of the first set of spatial audio components or a deviated version of the first set of spatial audio components as reference signal and by use of at least one received microphone signal;
wherein the deviated version is obtained by use of a spatial component combiner, by performing a linear processing or another processing.

According to another embodiment, a playback device or soundbar including an acoustic echo cancellation unit may have:
an audio processor configured to receive a multichannel audio signal and including:
a first stage which is configured to process the multichannel audio signal to obtain a first set of spatial audio components representing an interim signal; and
a second stage which is configured to process the first set of spatial audio components to obtain a second set of spatial audio components representing loudspeaker playback signals;
an echo cancellation processor configured to perform echo cancellation by use of the first set of spatial audio components or a deviated version of the first set of spatial audio components as reference signal and by use of at least one received microphone signal; wherein the deviated version is obtained by use of a spatial component combiner, by performing a linear processing or another processing.

According to yet another embodiment, a method for acoustic echo cancellation may have the steps of: receiving a multichannel audio signal; processing the multichannel audio signal to obtain a first set of spatial audio components representing an interim signal; processing the first set of spatial audio components to obtain a second set of spatial audio components representing loudspeaker playback signals; performing echo cancellation by use of the first set of spatial audio components or a deviated version of the first set of spatial audio components as reference signal and by use of at least one received microphone signal; wherein the deviated version is obtained by use of a spatial component combiner, by performing a linear processing or another processing.

According to yet another embodiment, a non-transitory digital storage medium may have a computer program stored thereon to perform the inventive method, when said computer program is run by a computer.

Embodiments of the present invention provide an acoustic echo cancellation unit, comprising: an audio processor configured to receive a multichannel audio signal and comprising: a first stage which is configured to process the multi-channel audio signal to obtain a first set of spatial audio components; and a second stage which is configured to process the first set of spatial audio components to obtain a second set of spatial audio components; an echo cancellation processor configured to perform echo cancellation by use of the first set of spatial audio components or a deviated version of the first set of spatial audio components as reference signal.

According to further embodiments, the echo cancellation processor comprises a spatial component combiner configured to process the first set of spatial audio components to obtain the deviated version of the first set of spatial components to be used as reference signal.

Embodiments of the present invention are based on the finding, that it is beneficial to apply a two stage process for sound processing, wherein the output signal/spatial component signal of the first stage is advantageously used as reference signal for the acoustic echo cancellation (when compared to the second stage). Here, the first spatial component signal which can be further processed to obtain the final spatial components and which is more suitable for acoustic echo cancellation than the final spatial components. For example, the interim signal can comprise component signals associated with the room directions to be rendered as 3D sound scene by the soundbar. According to an advantageous embodiment, the first spatial components are further processed before being used as reference signal. Therefore, also a deviated version of the first set of spatial components may be used. This deviated version is obtained by use of a spatial component combiner, e.g., by performing a linear processing or another processing.

Expressed in other words, this means that the first spatial components are accessed and processed with a spatial component combiner to obtain the reference signal. The resulting reference signal are used for—AEC. The use of the intermediate signals, i.e., the first spatial components in conjunction with a spatial component combiner enables to obtain a proper AEC reference signal or proper AEC reference signal what makes the AEC applicable in practice.

According to further embodiments, there is provided an acoustic echo cancellation unit, wherein the spatial component combiner is configured to output at least one reference signal or a reference signal comprising one, two or more channels. According to an embodiment, the spatial component combiner is configured to perform a linear combination of the first set of spatial components to obtain the reference signal and/or to apply a time-invariant downmix matrix to the first set of spatial components to obtain the reference signal. For Example the spatial component combiner may be configured to perform its processing based on the following formula $$R_i = \sum_{k=1}^{n} \beta_{ki} C_k$$

wherein $R_i$ is the ith reference signal, $\beta_{ki}$ are the weights, $C_k$ is the kth spatial component signal. Here, each reference signal is obtained from a subset of the first set of spatial components. In addition, each spatial component channel can only be used in maximal one reference signal channel.

According to embodiments, the spatial component combiner is configured to reduce the number of spatial components to obtain at least one reference signal.

Regarding the echo cancellation processor, it should be noted that typically, the echo cancellation is based on the microphone signal received via a microphone input. According to further embodiments, there is provided the acoustic echo cancellation unit, wherein the echo cancellation processor is configured to perform the echo cancellation using a single or multichannel adaptive filter or a single or multichannel adaptive filter which is configurable based on a comparison between the reference signal and a microphone signal.

According to another embodiment, there is provided an acoustic echo cancellation unit wherein the first stage is configured to perform a non-linear processing or a time-varying processing or a highly time-varying processing to obtain the first set of spatial audio components. According to another embodiment, the second stage is configured to output the second set of spatial audio components to a playback device or soundbar. Note, that according to further embodiments, there is provided an acoustic echo cancellation, wherein the set of spatial audio components enable to directly control one or more transducers of a playback device or to control one or more transducers of a playback device or soundbar by use of one or more amplifiers. For example, there is provided an acoustic echo cancellation unit, wherein the second stage is configured to perform a linear processing.

Another embodiment provides a playback device or soundbar comprising an acoustic echo cancellation unit.

According to a further embodiment, a method for acoustic echo cancellation is provided:

receiving a multichannel audio signal;
processing the multichannel audio signal to obtain a first set of spatial audio components;
processing the first set of spatial audio components to obtain a second set of spatial audio components;
performing echo cancellation by use of the first set of spatial audio components or a deviated version of the first set of spatial audio components as reference signal.

According to further embodiments, this method may be performed by use of a computer.

BRIEF DESCRIPTION OF THE DRAWINGS

Embodiments of the present invention will be detailed subsequently referring to the appended drawings, in which:

FIG. 3 shows a schematic block diagram of a sound cancellation approach according to conventional technology.

DETAILED DESCRIPTION OF THE INVENTION

Figure 1A:
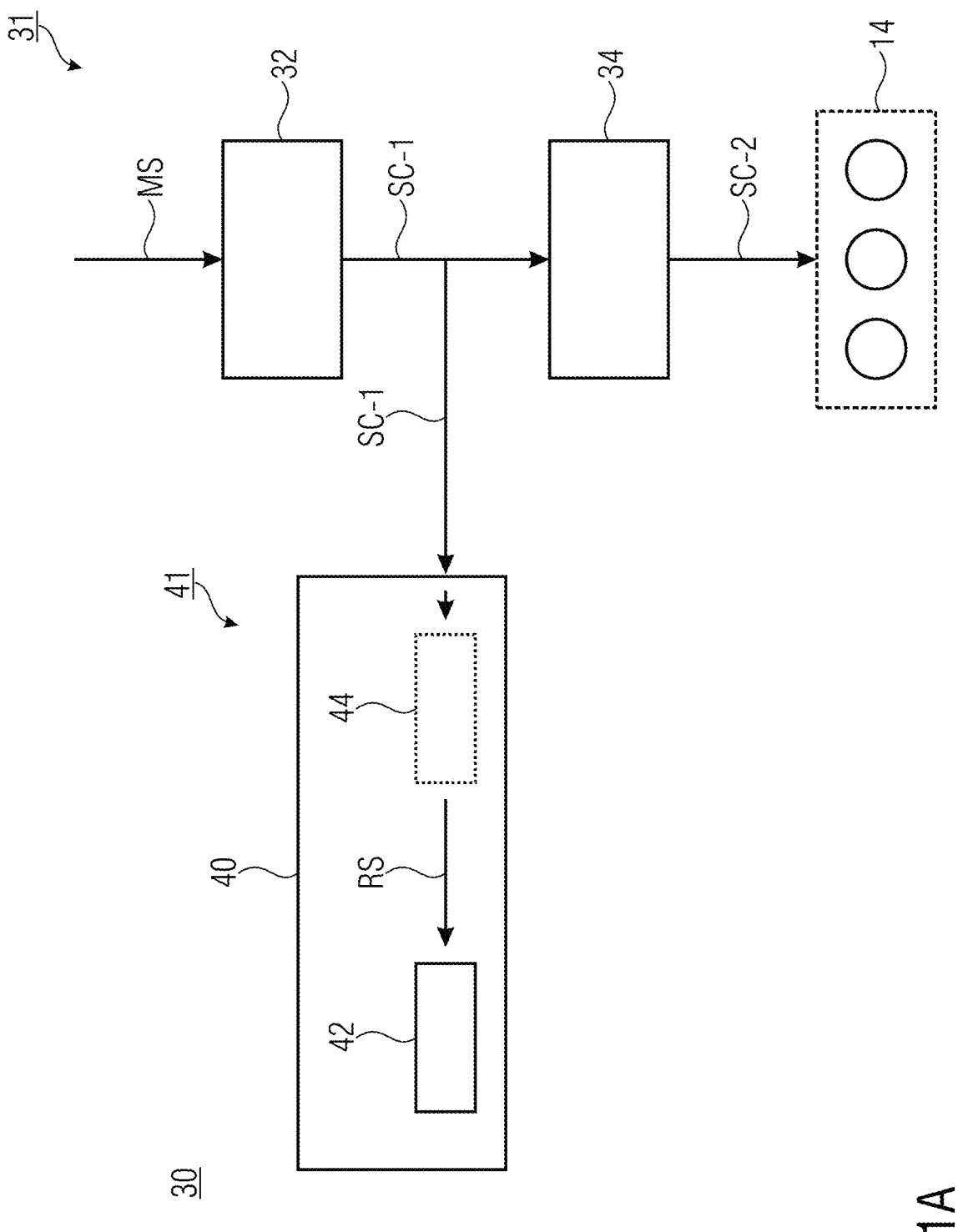
FIG. 1a shows a schematic block diagram illustrating an echo cancellation unit according to a basic embodiment.

Below, embodiments of the present invention will subsequently be discussed referring to the enclosed figures, wherein identical reference numerals are provided to objects having identical or similar function, so that a description thereof is interchangeable and mutually applicable.

FIG. 1a shows a sound cancellation unit 30 comprising the two paths 31 and 41. Within the path 31 a multichannel audio signal MS is processed so as to enable the playback of the multichannel audio signal MS by use of a sound reproduction device 14, e.g., a soundbar. Here, the processing as described in context of conventional technology is subdivided into two stages 32 and 34. The first stage 32 processes the multichannel audio signal MS to obtain an interim signal which is marked by the reference numeral SC_1. This interim signal SC_1 represents a first set of spatial component signals. This interim signal SC_1 is then further processed by use of the second stage 34 to obtain the second set of spatial component signals SC_2 enabling to derive the loudspeaker 14 directly. Directly driving means that no further spatial processing is used. I.e., the transducers of the soundbar 14 may be driven by the second set of spatial components (e.g., after amplifying the spatial components).

For example, the first stage 32 performs non-linear signal processing and/or (highly) time-varying processing. The second processing stage 34 may mainly perform linear time-invariant processing steps. Background for the subdividing into the two stages is that the processing steps performed by the second stage 34, e.g., the linear time-invariant processing steps can have a negative influence to the suitability for an echo cancellation.

The echo cancellation path 41 performs the echo cancellation based on the first set of spatial components SC_1. For this, the echo cancellation unit 40 receives the signal SC_1 from the first stage of audio processing 32. The echo cancellation unit 40 comprises at least an echo cancellation processor 42 performing the echo cancellation based on the reference signal RS. According to embodiments, the first set of spatial components SC_1 may be used as reference signal RS. According to a further (advantageous) embodiment, a deviated version of the first set of spatial components SC_1 may be used as reference signal RS. Therefore, the echo cancellation unit 40 may optionally comprise a processor 44 (e.g., a so-called combiner). This combiner 44 performs a processing, for example a linear processing to obtain the reference signal RS based on the first set of spatial components SC_1.

Just for the sake of completeness, it should be noted that typically the echo cancellation performed by the entity 42 uses beside the reference signal RS another input signal, e.g., received via one or more microphones (not shown) as will be discussed below.

Before discussing enhanced embodiments, the improved concept of echo cancellation will be discussed with respect to its method steps.

Figure 1B:
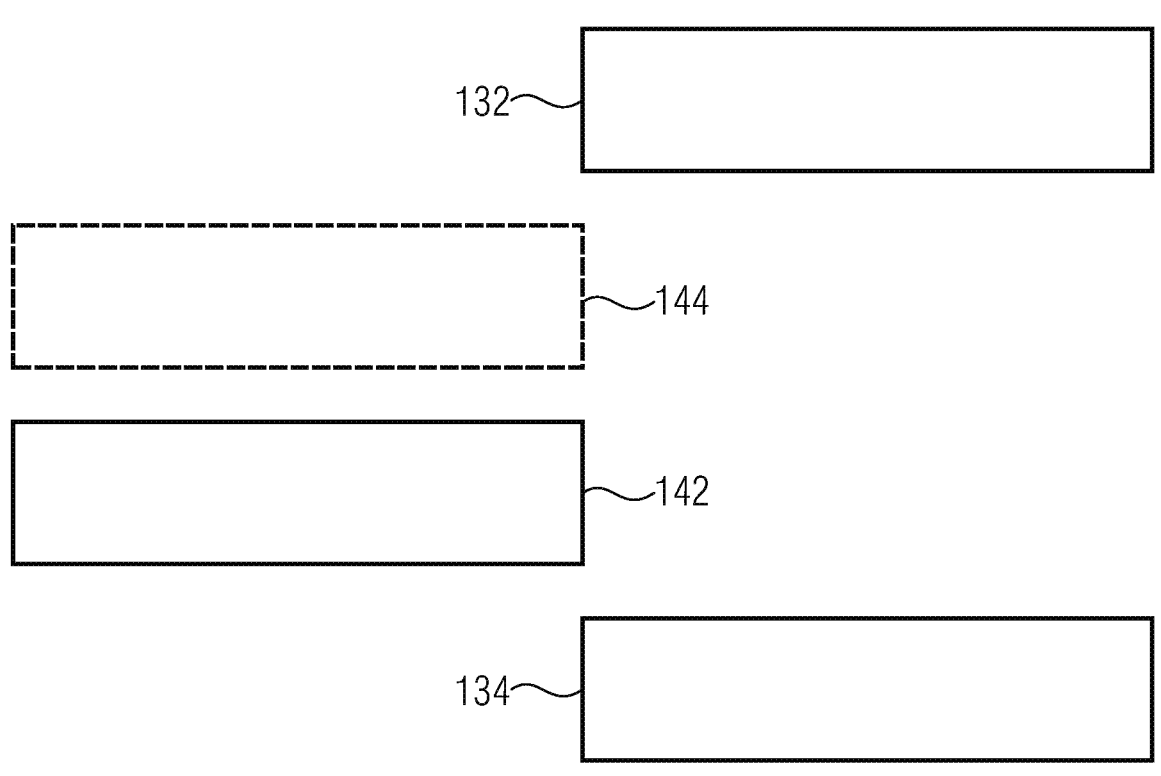
FIG. 1b shows a schematic flowchart illustrating the improved concept of echo cancellation according to a basic embodiment.

FIG. 1b shows the method steps of the echo cancellation method 100. Within the basic implementation, the acoustic echo cancellation 100 comprises the three basic steps 132, 142 and 134.

The steps 132 and 134 represent the audio processing performed within the first stages. Within the first stage 132, the multichannel audio signal (cf. reference numeral MS within FIG. 1a) to obtain the first set of spatial components SC_1 which is then further processed by the second stage 134 to obtain the second set of spatial components SC_2. In parallel to this second stage processing 132 plus 134, the echo cancellation processing is performed. This echo cancellation processing uses as input the signal SC_1, so that the first step of the echo cancellation is performed subsequently to the step 132. Here, the basic step of the echo cancellation is marked by the reference numeral 142 performing the echo cancellation based on the signal SC_1 used as reference signal. As discussed above, this process step 142 may use additional signals, e.g., a microphone signal as input signal. Optionally, another processing step 144 may be arranged before the step 142. This step 144 enables the processing of the first set of component signals SC_1 to obtain the reference signal RS.

Below, with respect to FIG. 2, optional elements of the echo cancellation processing will be discussed.

Figure 2:
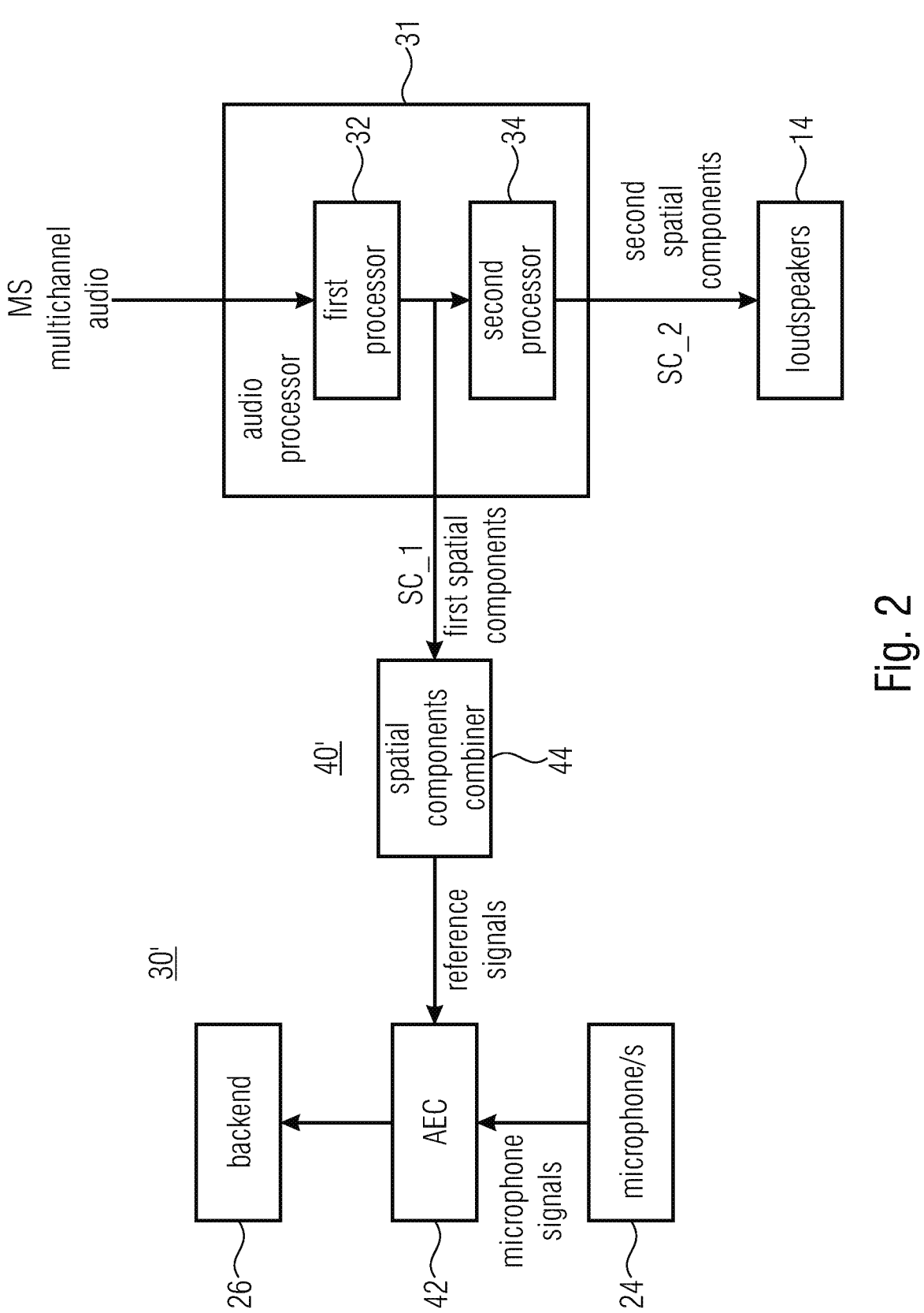
FIG. 2 shows a schematic block diagram of a sound cancellation approach according to an enhanced approach.

FIG. 2 shows an echo cancellation unit 30' comprising the audio processor 31 with the two stages 32 and 34 as well as the echo cancellation unit 40' comprising the two main stages 42 and 44 (cf. FIG. 1 a) as well as one or more microphones 24 and a backend processing 26.

Regarding the microphones 24 and the loudspeakers 14 it should be noted that same may be combined in one common or a plurality of common housings.

Regarding the backend processing 26 it should be noted that same may be used as human-machine interface, e.g., by use of voice recognition/far-field sound capturing or for applications like full-duplex communication.

Before, the functionality of the entire system 30' will be discussed.

Due to problems encountered by the state-of-the-art methods, we propose to use intermediate signals of the soundbar processing instead of the signals driving the loudspeakers as the AEC reference signal. The general approach is illustrated in FIG. 2. The audio processor 31 receives a multichannel audio signal 115 e.g. in a 5.1 surround format or a 7.1+4H immersive format. The audio input signals 115 are processed by a first processing block 32 to generate a set of first spatial component signals SC_1. The resulting set of spatial component signals SC_1 are not suitable for direct playback via the loudspeakers 14 of the soundbar (or any other multi-loudspeaker playback systems), but are the basis for further processing by the audio processing stage 39. The first spatial component signals SC_1 are input into a second audio processing block 34 in which a second set of spatial component SC_2 signals are generated. Typically, these component signals SC_2 are then reproduced by the loudspeakers 14 of the soundbar, i.e., they represent the loudspeaker playback signals.

In order to generate a suitable reference signal RS for the MC-AEC 42, the first set of spatial component signals SC_1 are further processed by the spatial component combiner 44. Typically, the spatial component combiner 44 determines the AEC reference signal RS by a linear combination of the first set of spatial component signals. In some embodiments, certain AEC reference signal RS may also correspond to one of the spatial component signals SC_1 without any further modification. In typical embodiments, the number of AEC reference signal RS is smaller than the number of spatial component signals SC_1, i.e., the spatial component combiner 44 reduces the number of signals. One advantage is that the configuration and the computational complexity of the MC-AEC 42 is not directly dependent on the number of loudspeakers 14. The reduction of the computational complexity is especially relevant if the number of loudspeakers 14 included in the soundbar is significantly larger compared to the number of AEC reference signal RS. Another advantage is that the statistical properties of the loudspeaker driving signals are often not suitable for using them directly as AEC reference signal RS due to high correlations between the different loudspeaker channels, whereas the AEC reference signal RS derived from the first set of spatial component signals usually have properties that are better suited for adaptive filtering by the MC-AEC 42.

According to embodiments, the echo paths to be modeled by the MC-AEC 42 based on the AEC reference signal RS are advantageously (only) slowly time-varying and linear. Therefore, it is important to appropriately distribute different processing steps between the first and the second processing blocks 32 and 34 of the audio processor 31/of the soundbar processing chain 31. For example, any non-linear or highly time-varying processing steps should be applied in the first processor 32, while the second processing block should contain mainly linear time-invariant processing steps 34.

In some embodiments the first processor generates spatial component signals SC_1 associated with the left, right, center, low-frequency, top and rear portion of a 3D sound scene as rendered with the soundbar 14. A suitable implementation of the spatial component combiner 44 would generate AEC reference signal 25 as a linear combination of the first set of spatial components, e.g., by applying a time-invariant downmix matrix to the spatial components SC_1 as shown in the Equation 1:

$$R_i = \sum_{k=1}^{n} \beta_{ki} C_k$$

where $R_i$, is the i'th AEC reference signal, $\beta_k i$, are the weights, $C_k$ is the k'th spatial component signal. For example let the left, right, center, low-frequency, top and rear portions be represented by $C_1$, $C_2$, $C_3$, $C_4$, $C_5$ and $C_6$, respectively. If a 2 channel AEC reference signal is desired the spatial component combiner could combine the components by applying the following weights:

$$\beta_{k1} = \begin{cases} 1, & k = 1, 2, 4 \\ 0, & \text{otherwise} \end{cases}$$

$$\beta_{k2} = \begin{cases} 1, & k = 3, 5, 6 \\ 0, & \text{otherwise} \end{cases}$$

In this case the 2 channel AEC reference signal may be obtained as follows:

$$R_1 = C_1 + C_2 + C_4$$

$$R_2 = C_3 + C_s + C_6$$

The processing performed by the echo cancellation unit 30' can be described as follows:

1) Receive a multichannel audio signal 115 (at least 2 channels) and at least one microphone signal.
2) Process the received multichannel audio signal 115 with a first audio processor 32 to obtain a first set of spatial component signals SC_1. The processing may include time-varying and/or non-linear processing steps.
3) Process the set of first spatial component signals SC_1 with a second audio processor 34 to obtain a second set of spatial component signals SC_2.
4) Output the second set of spatial component signals SC_2 on a playback device 14 having multiple loudspeakers (e.g. soundbar).
5) Combine the first set of spatial component signals SC_1 to obtain a set of AEC reference signal RS. This step may be processed by use of the processor 44.
6) Perform echo cancellation, for example using a multichannel adaptive filter, based on the AEC reference signal RS and the received microphone signals. As illustrated this step is performed by the entity 42.

According to a further embodiment, an additional step 5a (subsequent to the step 5 before the step 6) may be performed: process first set of spatial components SC_1 with a spatial component combiner 44 resulting in the number of AEC reference signal RS being smaller than the number of the spatial components SC_1.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

Although in above embodiments, the audio processor 31 has been described as having just the first stage 32 and the second stage 34, it should be noted that same may have additional stages, e.g. an amplification stage at the output of 34, an input stage at the input of 32 and/or a stage between 32 and 34.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An acoustic echo cancellation unit, comprising:
an audio processor configured to receive a multichannel audio signal and comprising:
a first stage which is configured to process the multichannel audio signal to acquire a first set of spatial audio components representing an interim signal; wherein the first stage is configured to perform a non-linear processing or a time-varying processing or a highly time-varying processing to acquire the first set of spatial audio components; and
a second stage which is configured to process said first set of spatial audio components to acquire a second set of spatial audio components representing loudspeaker playback signals;
an echo cancellation processor configured to perform echo cancellation by use of said first set of spatial audio components or a deviated version of the first set of spatial audio components as reference signal and by use of at least one received microphone signal; wherein the deviated version is acquired by use of a spatial component combiner, by performing a linear processing or another processing.

2. Acoustic echo cancellation unit according to claim 1, wherein the echo cancellation processor comprises a spatial component combiner configured to process the first set of spatial audio components to acquire the deviated version of the first set of spatial components to be used as reference signal.

3. Acoustic echo cancellation unit according to claim 2, wherein the spatial component combiner is configured to output one reference signal or more reference signals or a reference signal comprising one, two or more channels.

4. The acoustic echo cancellation unit according to claim 2, wherein the spatial component combiner is configured to perform a processing so as to output one or more linear combinations of the first set of spatial components as the reference signal and/or to apply a time-invariant downmix matrix to the first set of spatial components to acquire the reference signal.

5. The acoustic echo cancellation unit according to claim 2, wherein the spatial component combiner is configured to perform its processing based on the following formula $$R_i = \sum_{k=1}^{n} \beta_{ki} C_k$$

wherein $R_i$ is the ith reference signal, $\Box_{ki}$ are the weights, $C_k$ is the kth spatial component signal.

6. Acoustic echo cancellation unit according to claim 2, wherein the spatial component combiner is configured to output one or more signals of the reference signal comprising a reduced number when compared to the number of spatial audio components of the first set of spatial audio components.

7. Acoustic echo cancellation unit according to claim 1, where the reference signal is a subset of the first set of spatial audio components.

8. Acoustic echo cancellation unit according to claim 1, where each spatial component of the first set of spatial audio components is comprised by a maximum of one signal of the reference signal.

9. Acoustic echo cancellation unit according to claim 1, wherein the echo cancellation processor performs the echo cancellation based on at least a microphone signal received via a microphone input.

10. The acoustic echo cancellation unit according to claim 1, wherein the echo cancellation processor is configured to perform the echo cancellation using a single or multichannel adaptive filter or a single or multichannel adaptive filter which is configurable based on a comparison between the reference signal and a microphone signal.

11. The acoustic echo cancellation unit according to claim 1, wherein the second stage is configured to output the second set of spatial audio components to a playback device or soundbar.

12. Acoustic echo cancellation unit according to claim 11, wherein the set of spatial audio components enable to directly control one or more transducers of a playback device or to control one or more transducer of a playback device or soundbar by use of one or more amplifiers.

13. Acoustic echo cancellation unit according to claim 1, wherein the second stage is configured to perform a linear processing.

14. Playback device or soundbar comprising an acoustic echo cancellation unit, comprising:
an audio processor configured to receive a multichannel audio signal and comprising:
a first stage which is configured to process the multichannel audio signal to acquire a first set of spatial audio components representing an interim signal; and
a second stage which is configured to process the first set of spatial audio components to acquire a second set of spatial audio components representing loudspeaker playback signals;
an echo cancellation processor configured to perform echo cancellation by use of the first set of spatial audio components or a deviated version of the first set of spatial audio components as reference signal and by use of at least one received microphone signal; wherein the deviated version is acquired by use of a spatial component combiner, by performing a linear processing or another processing;

wherein the first stage is configured to perform a non-linear processing or a time-varying processing or a highly time-varying processing to acquire the first set of spatial audio components.

15. A method for acoustic echo cancellation, comprising:

receiving a multichannel audio signal;

processing the multichannel audio signal to acquire a first set of spatial audio components representing an interim signal; wherein the processing comprises non-linear processing or time-varying processing or highly time-varying processing to acquire the first set of spatial audio components;

processing the first set of spatial audio components to acquire a second set of spatial audio components representing loudspeaker playback signals;

performing echo cancellation by use of the first set of spatial audio components or a deviated version of the first set of spatial audio components as reference signal and by use of at least one received microphone signal; wherein the deviated version is acquired by use of a spatial component combiner, by performing a linear processing or another processing.

16. A non-transitory digital storage medium having a computer program stored thereon to perform the method for acoustic echo cancellation, said method comprising:

receiving a multichannel audio signal;

processing the multichannel audio signal to acquire a first set of spatial audio components representing an interim signal; wherein the processing comprises non-linear processing or time-varying processing or highly time-varying processing to acquire the first set of spatial audio components;

processing the first set of spatial audio components to acquire a second set of spatial audio components representing loudspeaker playback signals;

performing echo cancellation by use of the first set of spatial audio components or a deviated version of the first set of spatial audio components as reference signal and by use of at least one received microphone signal; wherein the deviated version is acquired by use of a spatial component combiner, by performing a linear processing or another processing, when said computer program is run by a computer.

\* \* \* \* \*